US007286006B2

(12) United States Patent
Jaussi et al.

(10) Patent No.: US 7,286,006 B2
(45) Date of Patent: Oct. 23, 2007

(54) SIGN-SIGN LEAST MEANS SQUARE FILTER (75) Inventors: James E. Jaussi, Hillsboro, OR (US);
Bryan K. Casper, Hillsboro, OR (US);
Ganesh Balamurugan, Urbana, IL
(US); Stephen R. Mooney, Beaverton,
OR (US)

(73) Assignee: Intel Corporation, Santa Clara, CA (US)

( * ) Notice: Subject to any disclaimer, the term of this patent is extended or adjusted under 35 U.S.C. 154(b) by 113 days.

(21) Appl. No.: 10/879,417

(22) Filed: Jun. 28, 2004

(65) Prior Publication Data
US 2005/0285667 A1   Dec. 29, 2005

(51) Int. Cl.
*H03K 5/00* (2006.01)
(52) U.S. Cl. .................. 327/551; 375/232; 708/319; 708/322
(58) Field of Classification Search ............ 327/94, 327/551–559, 356; 375/233, 232; 708/300, 708/301, 319, 322
See application file for complete search history.

(56) References Cited

U.S. PATENT DOCUMENTS

| | | | | | |
|---|---|---|---|---|---|
| 4,709,357 | A | * | 11/1987 | Maki, Jr. ................ | 367/35 |
| 5,418,817 | A | * | 5/1995 | Richter ................. | 375/232 |
| 5,475,710 | A | * | 12/1995 | Ishizu et al. ........... | 375/232 |
| 5,528,625 | A | * | 6/1996 | Ayanoglu et al. ....... | 375/222 |
| 5,598,428 | A | * | 1/1997 | Sato ..................... | 375/148 |
| 6,101,219 | A | * | 8/2000 | Perez Abadia et al. ... | 375/231 |
| 6,563,373 | B1 | * | 5/2003 | Shou et al. ............ | 327/554 |
| 6,601,007 | B1 | * | 7/2003 | Amir et al. ............ | 702/107 |
| 6,621,330 | B1 | * | 9/2003 | Jaussi et al. ........... | 327/552 |
| 6,768,372 | B2 | * | 7/2004 | Jaussi et al. ........... | 327/552 |
| 6,791,399 | B2 | * | 9/2004 | Jaussi et al. ........... | 327/553 |

FOREIGN PATENT DOCUMENTS

GB           2336277         * 10/1999

* cited by examiner

*Primary Examiner*—Dinh T. Le
(74) *Attorney, Agent, or Firm*—Racheol Wu (57) ABSTRACT

In some embodiments, an adaptive filter employs two adaptation modes, where during one adaptation mode the adaptive filter is updated only when the received training sample is a first binary value and during the other adaptation mode the adaptive filter is updated only when the received sample is a second binary value. Each adaptation mode provides a set of filter weights, and these two sets of filter weights are averaged to provide an adapted set of filter weights. The use of two adaptation mode allows for a clock boundary in which the digital portion of the filter operates at a lower clock rate than the analog portion. In other embodiments, a filter architecture is described for providing the algebraic signs of the received data samples, important for sign-sign least means square filtering algorithms. In other embodiments, a filter architecture is described in which efficient use is made of voltage-to-current converters so as to achieve a high throughput rate during filtering. Embodiments of the present invention have application to channel equalization.

25 Claims, 11 Drawing Sheets (PRIOR ART)
Fig. 1

(PRIOR ART)

Fig. 7

(PRIOR ART)

SIGN-SIGN LEAST MEANS SQUARE FILTER

FIELD

Embodiments of the present invention relate to analog circuits, and more particularly, to discrete-time analog filters.

BACKGROUND

Figure 1:
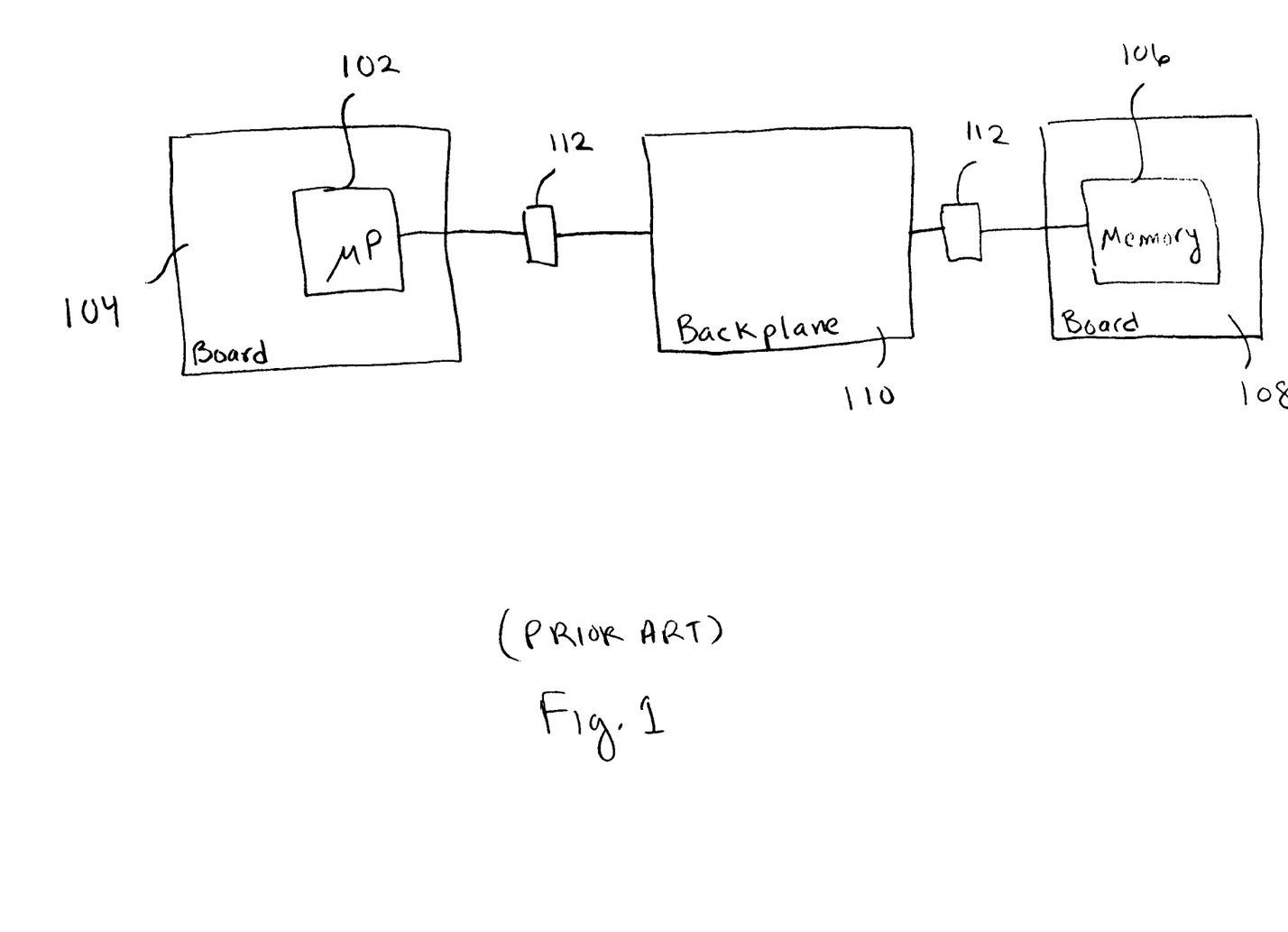
FIG. 1 is a high-level abstraction of a server system, illustrating signaling between boards via a backplane.

FIG. 1 provides a high-level abstraction of a portion of a computer server or system, where microprocessor 102 resides on board 104 and communicates with memory 106 on board 108. The communication is by way of striplines on backplane 110. Backplane 110 is connected to boards 104 and 108 by connectors 112. Not shown in FIG. 1 are other memory units and microprocessors, where the various microprocessors and memory units may communicate to one another so as to access or write data and instructions.

Figure 2A:
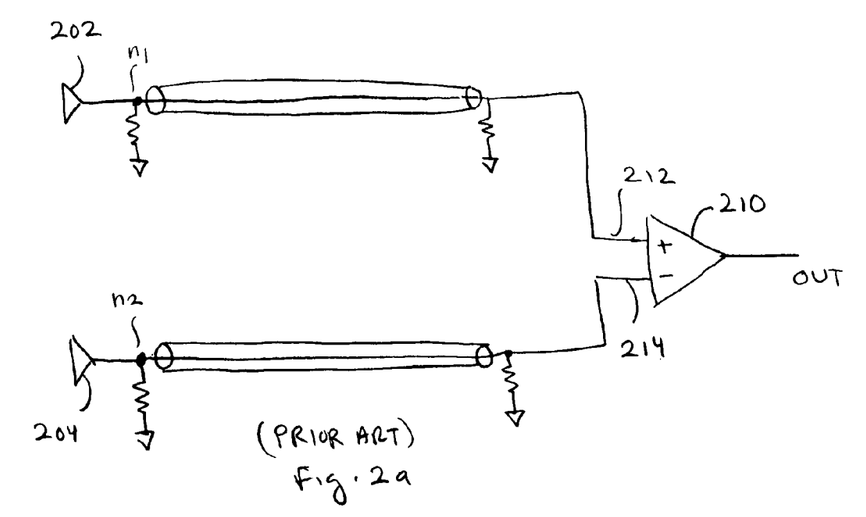
FIG. 2a illustrates differential signaling on two transmission lines.

Communication of signals over backplane 110 may be modeled by transmission line theory. Often, the signaling is based upon differential signaling, whereby a single bit of information is represented by a differential voltage. For example, FIG. 2a shows drivers 202 and 204 driving transmission lines 206 and 208, respectively. For differential signaling, drivers 202 and 204 drive their respective transmission lines to complementary voltages. Typical curves for the node voltages at nodes n1 and n2 for a bit transition are provided in FIG. 2b, where the bit transition is indicated by a dashed vertical line crossing the time axis. The information content is provided by the difference in the two node voltages.

For short-haul communication, such as for the computer server in FIG. 1, the signal-to-noise ratio is relatively large. If the transmission lines are linear, time-invariant systems having a bandwidth significantly greater than that of the transmitted signal, then a relatively simple receiver architecture may be employed to recover the transmitted data. Such a receiver is abstracted by comparator 210, which provides a logic signal in response to the difference in the two received voltages at ports 212 and 214.

However, every transmission line has a finite bandwidth, and for signal bandwidths that are comparable to or exceed the transmission line (channel) bandwidth, intersymbol interference may present a problem. Furthermore, actual transmission lines may have dispersion, whereby different spectral portions of a signal travel at different speeds. This may result in pulse spreading, again leading to intersymbol interference. As a practical example, for high data rates such as 10 Gbs (Giga bits per second), the transmission lines used with backplanes or motherboards are such that intersymbol interference is present.

Channel equalization is a method in which a filter is employed at a receiver so as to equalize the channel. (A filter may also be employed at a transmitter.) The use of digital filters for channel equalization is well known. A digital filter may operate in a fixed mode, where its corresponding filter response (filter weights) are fixed for a period of time, or it may operate in an adaptation mode, where the filter weights adapt over an adaptation time interval. In practice, a channel equalizer may first be operated in its adaptation mode when a communication session begins, followed by operating in its fixed mode for the remaining of the communication session, or perhaps alternating between fixed mode and adaptation mode during a communication session.

Figure 3:
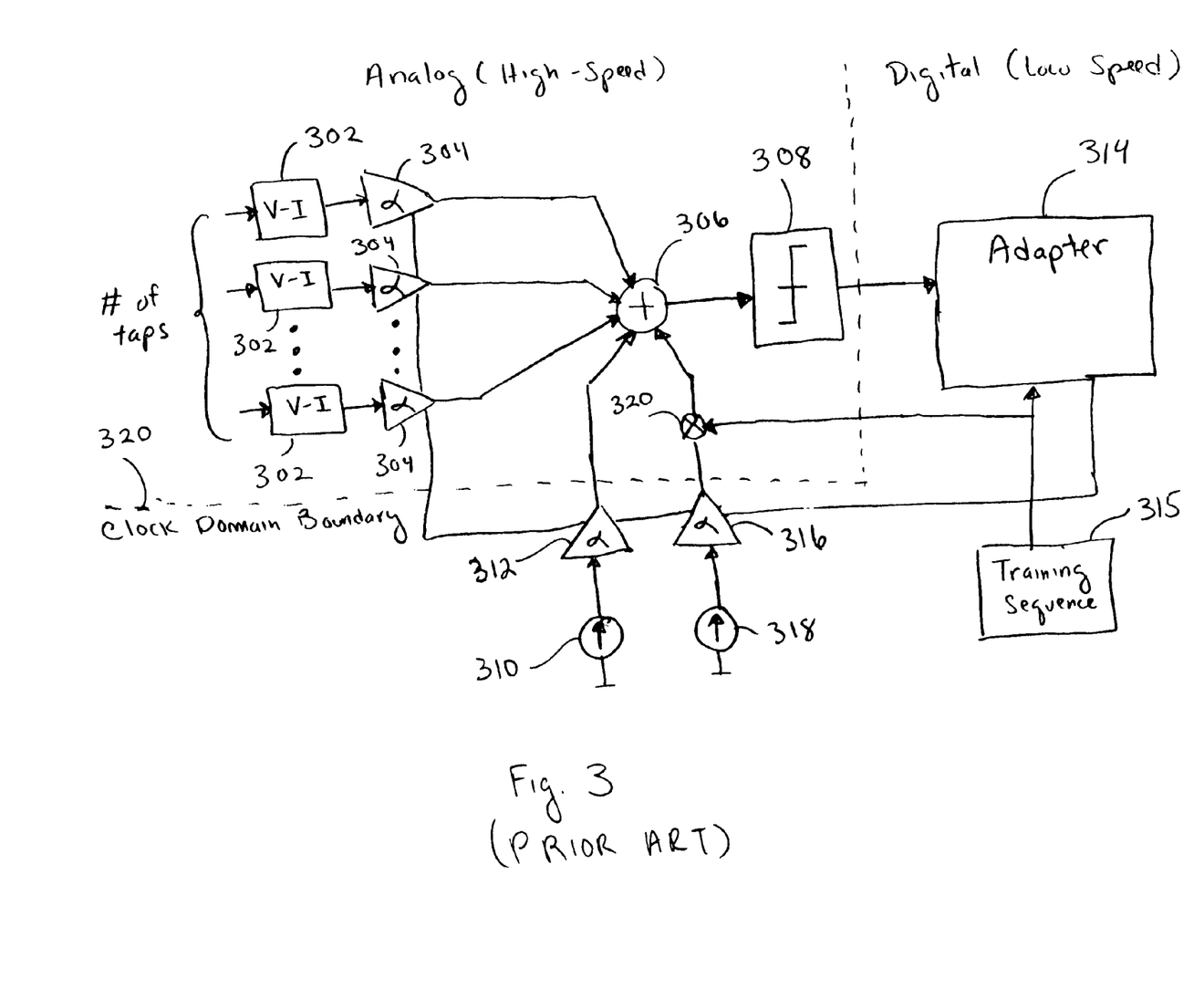
FIG. 3 is a known filter structure for implementing fixed and adaptive filtering.

Portions of a filter architecture may be used for both fixed mode and adaptation mode operation. FIG. 3 shows a known high-level filter architecture. Functional blocks 302 and 304 represent V-I converters and current multipliers, respectively. A received voltage is sampled at various times to provide input voltages to V-I converters 302, where each V-I converter receives a sample at different times. (For simplicity, sampling capacitors are not shown.) A filter tap is implemented by a V-I converter followed by a current multiplier. The current multiplication implemented by a current multiplier provides a weighting function, with different current multipliers having in general different multipliers. The number of V-I converter, current multiplier pairs is the number of filter taps implemented. The outputs of current multipliers 304 are provided to a current summing junction 306, followed by latch 308. Latch 308 provides a comparison function, so that the output of latch 308 is binary.

Figure 2B:
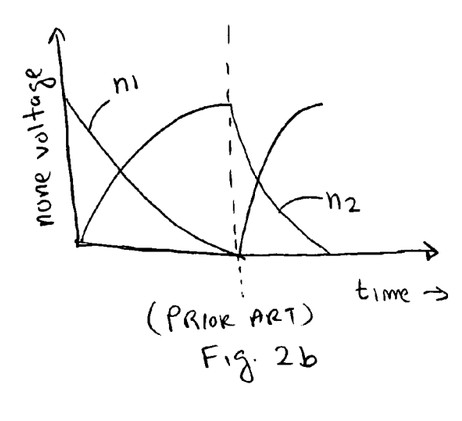

In practice, the filter structure of FIG. 3 may be used in a differential signaling scheme, as discussed with respect to FIGS. 2a and 2b. In such a case, it should be noted that the inputs and outputs of the various analog functional blocks in FIG. 3 are differential signals. For example, the input to latch 308 may be a differential signal, say $V_1$ and $V_2$, where ideally the output of latch 308 is HIGH or LOW depending upon the algebraic sign of $(V_1-V_2)$. In practice, latch 308 will have an input current offset, so that an offset current provided by current source 310 and current multiplier 312 is provided to mitigate the offset of latch 308.

The combination of V-I converters 302 and current multipliers 304 constitutes a weighted tap delay line, and together with current summing junction 306, provides a FIR (Finite Impulse Response) filter. (Latch 308, together with current source 310 and current multiplier 312 to provide an offset, provides a detection function, where the output of latch 308 is a Boolean 1 or 0.) V-I converters 302 and current multipliers 304 may also form part of an adaptive filter structure, where the various current multipliers are controlled digitally by adapter functional block 314.

To implement an adaptive filter, a training sequence functional unit 315 stores at the receiver a training sequence. During adaptation, this known training sequence is transmitted by the transmitter. On the receive side during adaptation, the training sequence is used to modulate the output of current multiplier 316 and current source 318, indicated by functional multiplier unit 320, which is then provided to current summing junction 306 to provide an error signal. Multiplier 316 is utilized to properly scale the current provided to summing junction 306, in which case the training sequence may be taken as a sequence having values 1 or −1.

The resulting error signal is utilized by adapter 314 to adjust the various current multipliers, so as to effect any number of adaptive filtering algorithms, such as for example a LMS (least means square) type of adaptive algorithm. Some adaptive algorithms also require adapter 314 to directly utilize the training sequence, as indicated in FIG. 3 by a direct connection from training sequence functional unit 315 to adapter 314. In practice, the analog portion of the circuit architecture in FIG. 3 may be operated at a much higher data rate than that of the digital logic portion, in which case it is desirable to have two clock domains, where dashed line 320 indicates a clock domain boundary separating the high-speed analog circuit portion from the low-speed digital circuit portion.

With the filter architecture of FIG. 3, setting current multiplier 320 should be performed within the analog clock domain, yet the training sequence available for setting current multiplier 320 is within the slower, digital clock domain. Consequently, the filter architecture of FIG. 3 may result in violation of clock domain boundary 320.

BRIEF DESCRIPTION OF THE DRAWINGS

FIG. 2b shows typical voltage curves representing differential signaling on the transmission lines of FIG. 2a.

DESCRIPTION OF EMBODIMENTS

Figure 4:
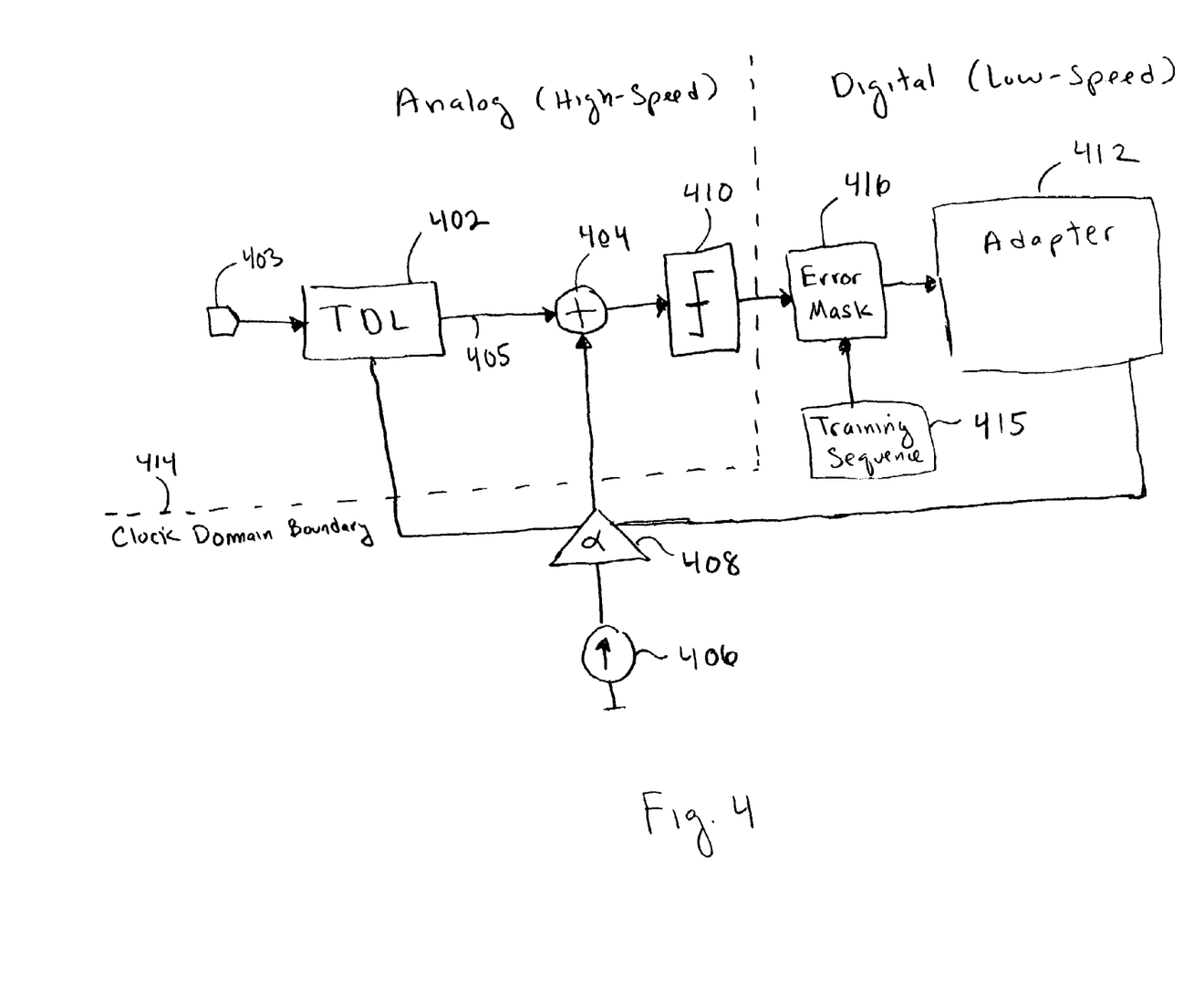
FIG. 4 is a filter structure according to an embodiment of the present invention.

A high-level representation of a filter architecture according to an embodiment of the present invention is provided in FIG. 4. TDL 402 represents a weighted tap delay line, which may include the arrangement of V-I converters 302 and current multipliers 304 in FIG. 3. The input to TDL 402 at input port 403 is the received voltage signal, and its output signal at output port 405 comprises a plurality of current signals indicative of the weighted taps, where these currents are provided to current summing junction 404. Particular embodiments of TDL 402 will be described later. Current source 406 and reference current source 408 provide a current to current summing junction 404 to help mitigate any offset inherent in latch 410. For clarity, reference current source 408 will be referred to as an offset and reference current source, or for brevity a reference current source, so as not to confuse it with the current multipliers employed within TDL 402.

When operated in a stationary (non-adaptive) mode, the combination of TDL 402, current source 406 together with reference current source 408, current summing junction 404, and latch 410 provides channel equalization and bit detection. When operated in an adaptation mode, the current multipliers in TDL 402 as well as reference current source 408 are digitally controlled by adapter 412, as in the filter architecture of FIG. 3. However, for embodiments according to the architecture of FIG. 3, reference current source 408 provides both the offset current and the current needed to form the error sequence, and there is no requirement for functional unit 320 found in FIG. 3. This is facilitated by use of error mask 416. For conceptual purposes, error mask 416 is indicated as a separate functional unit distinct from adapter 412, but in practice error mask 416 and adapter 412 may be considered as a single adaptation functional unit.

As described below, the use of an error mask allows the implementation of two adaptation modes such that there is no violation of clock domains. (Although FIG. 4 indicates that reference current source 408 and the weights within TDL 402 are updated by adapter 412, these updates may be performed at the relatively slow digital logic clock rate so that there is no violation of the clock domains.)

There are two adaptation modes. Let d(t) denote the training sequence stored in adapter 412, which is transmitted by the transmitter during adaptation. During a first adaptation mode, at each time t error mask 416 masks out the error term if the training or expected data d(t) represents a first type of information bit, say for example when d(t)=1, and lets through the error term to adapter 412 if the expected data d(t) is of a second type of information bit complementary to the first type, say for example d(t)=−1. Masking an error term may be accomplished by simply setting it to zero. The filter weights associated with TDL 402 are then updated throughout the range of the time index t, say for the range $0 \leq t \leq T$, to form a first adaptation mode filter weight During a second adaptation mode, at each time t error mask 416 masks out the error term if d(t)=−1 and lets through the error term to adapter 412 if d(t)=1. The filter weights associated with TDL 402 are then updated throughout the range of the time index t to form a second adaptation mode filter weights. The filter weights are then averaged at the end of the adaptation period, t=T, to obtain the updated filter weights for the training sequence. A similar procedure may be utilized to update the scale factor current provided by reference current source 408.

Various algorithms may be implemented with the filter architecture of FIG. 4. One such algorithm is the zero forcing algorithm, which is described below. However, embodiments of the present invention are not limited to this type of adaptive algorithm.

During adaptation, let the received signal be denoted by x(t) and let the set of filter weights at be represented by the vector $\bar{h}(t)$, where t is a discrete time index. Physically, x(t) may be obtained from a continuous-time signal by sampling. The filter vector $\bar{h}(t)$ may be taken as n-dimensional, so that the individual filter weights may be denoted as $[\bar{h}(t)]_i$, i=0,1, ..., n−1. The output signals (currents) provided by TDL 402 are $[\bar{h}(t)]_i [x(t-i+\Delta)]$, i=0,1, ..., n−1, where $\Delta$ is an integer between 0 and n−1 to set the relative amounts of pre-cursor and post-cursor processing. When these currents are summed by current summing junction 404, the result may be represented by the filtered signal z(t), where $$z(t) = \sum_{i=0}^{n-1} [\bar{h}(t)]_i \, x(t-i+\Delta).$$

It is convenient to define the n-dimensional received data vector $\bar{x}(t)$ as $[\bar{x}(t)]_i = x(t-i+\Delta)$, i=0,1, ..., n−1.

With the above definitions, by utilization of error mask functional unit 416 for two adaptation modes, embodiments for implementing the zero forcing algorithm update the filter weights as $$[\bar{h}_0(t+1)]_i = \begin{cases} [\bar{h}_0(t)]_i + \mu \, sgn\{[-K-z_0(t)]d(t-i+\Delta)\}, & d(t)=-1, \quad i \neq \Delta \\ [\bar{h}_0(t)]_i, & d(t)=1, \quad i \neq \Delta \\ 1, & i=\Delta \end{cases}$$

and $$[\bar{h}_1(t+1)]_i = \begin{cases} [\bar{h}_1(t)]_i + \mu \, sgn\{[K-z_1(t)]d(t-i+\Delta)\}, & d(t)=1, \quad i \neq \Delta \\ [\bar{h}_1(t)]_i, & d(t)=-1, \quad i \neq \Delta \\ 1, & i=\Delta \end{cases}$$

where the filtered outputs $z_0(t)$ and $z_1(t)$ are defined as $$z_j(t) = \sum_{i=0}^{n-1} [\bar{h}_j(t)]_i \, x(t-i+\Delta), \quad j=0,1.$$

At the end of adaptation for both modes, the filter weight vector is obtained by $$\bar{h}(T) = \frac{\bar{h}_0(T) + \bar{h}_1(T)}{2}.$$

For simplicity, we have denoted the time index range for both adaptation modes as $0 \leq t \leq T$. This may be viewed as re-setting t to zero for each adaptation mode. In practice, the two adaptation modes need not be of equal length. However, the filter structure of FIG. 4 may be duplicated so that both adaptation mode filters may be obtained in parallel, over the same time interval.

The above expressions for updating the filter weights assume that that latch (comparator) functional unit 410 implements an ideal sign function, but in practice, this will not be the case because an offset should be included to account for the offset of latch 410. With this in mind, and remembering that sgn{ab}=sgn{a}sgn{b} for any a and b, it may be more pedagogically useful to rewrite the above updates for the two adaptation mode filter vectors as $$[\bar{h}_0(t+1)]_i =$$
$$\begin{cases} [\bar{h}_0(t)]_i + \mu \langle sgn \rangle \{-K+K_{offset}-z_0(t)\} sgn\{d(t-i+\Delta)\}, & d(t)=-1, \quad i \neq \Delta \\ [\bar{h}_0(t)]_i, & d(t)=1, \quad i \neq \Delta \\ 1, & i=\Delta \end{cases}$$

and $$[\bar{h}_1(t+1)]_i =$$
$$\begin{cases} [\bar{h}_1(t)]_i + \mu \langle sgn \rangle \{K+K_{offset}-z_1(t)\} sgn\{d(t-i+\Delta)\}, & d(t)=1, \quad i \neq \Delta \\ [\bar{h}_1(t)]_i, & d(t)=-1, \quad i \neq \Delta \\ 1, & i=\Delta \end{cases}$$

where the function sgn{ } is performed in the digital domain and may be considered exact, the function $\langle sgn \rangle${ } is an approximation to the sign function and is performed in the analog domain by latch functional unit 410, and $K_{offset}$ is an offset term added so that $\langle sgn \rangle${ } approximates an ideal sign function.

In light of the above discussion, referring to reference current source 408 in FIG. 4, during the first adaptation mode for updating $\bar{h}_0(t)$ the multiplication α is set so as to provide a current $-K+K_{offset}$ to summing junction functional unit 404 (which actually forms the difference of $-K+K_{offset}$ and $z_0(t)$), and during the second adaptation mode for updating $\bar{h}_1(t)$ the multiplication a is set so as to provide a current $K+K_{offset}$ to summing junction functional unit 404.

The scale factor K may itself be updated during an adaptation period. More particularly, two adaptation modes are implemented for updating a first mode scale factor $K_0$ during the first adaptation mode, and a second scale factor $K_1$ during the second adaptation mode, and at the end of adaptation the average of these two scale factors are taken to provide the scale factor. The filter architecture of FIG. 4 may be employed, but where now only the multiplier α in reference current source 408 is updated by adapter 412, and the filter weights stay constant during the adaptation modes. As for the case of updating the filter weights, an error mask is used so that at each time t error mask 416 masks out the error term if the training or expected data d(t) represents a first type of information bit, say for example when d(t)=1, and lets through the error term to adapter 412 if the expected data d(t) is of a second type of information bit complementary to the first type, say for example d(t)=−1.

An example of an update algorithm for the scale factor is $$K_0(t+1) = \begin{cases} K_0(t) - \mu_K \langle sgn \rangle\{-K_0(t)+K_{offset}-z(t)\}, & d(t)=-1 \\ K_0(t), & d(t)=1 \end{cases},$$

and $$K_1(t+1) = \begin{cases} K_1(t) - \mu_K \langle sgn \rangle\{-K_1(t)+K_{offset}-z(t)\}, & d(t)=1 \\ K_1(t), & d(t)=-1 \end{cases},$$

where $\mu_K$ is a forget factor. Letting the time interval for each adaptation mode be $0 \leq t \leq T$, the scale factor at the end of the adaptation is $$K = \frac{K_0 + K_1}{2}.$$

Figure 5:
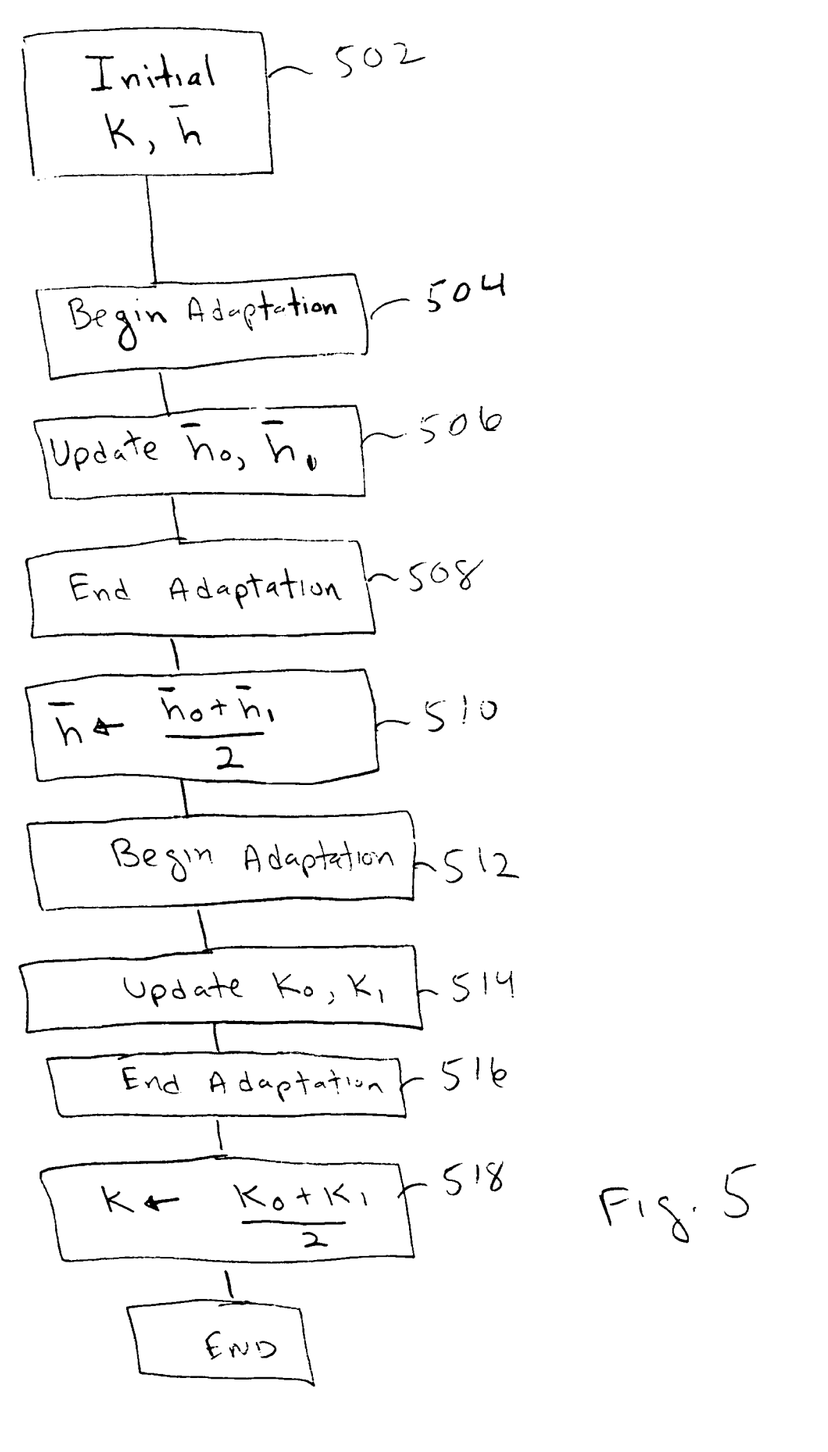
FIG. 5 is a flow diagram for updating the two adaptation mode filters and scale factors according to an embodiment of the present invention.

Note that updating the filter weights requires K, and updating K requires the filter weights. Consequently, some kind of bootstrap procedure should be used. For example, an estimate of K may be initially made so that the filter weights may be obtained after an adaptation period. Then, using the updated filter weights, a better estimate of K may be obtained during another adaptation period using the above update equations. This procedure may be repeated, whereby the filter weights and the scale factor are alternately updated over different adaptation periods. An iteration of this procedure is shown in the flow diagram of FIG. 5, where in box 502 an initial scale factor and filter weight vector is indicated, and an adaptation period begins in box 504 so that the two adaptation mode filters $\bar{h}_0$ and $\bar{h}_1$ are updated in box 506. Updating these two filters may be performed simultaneously or sequentially whereby first one adaptation mode filter is updated and then the other. After adaptation, box 508, the average of these two filters is taken in box 510 to form the updated filter $\bar{h}$. (For simplicity, the time index is suppressed in FIG. 5.) A similar procedure is performed in boxes 512, 514, 516, and 518 to update the two adaptation mode scale factors $K_0$ and $K_1$, and to take their average to update the scale factor K.

Figure 6:
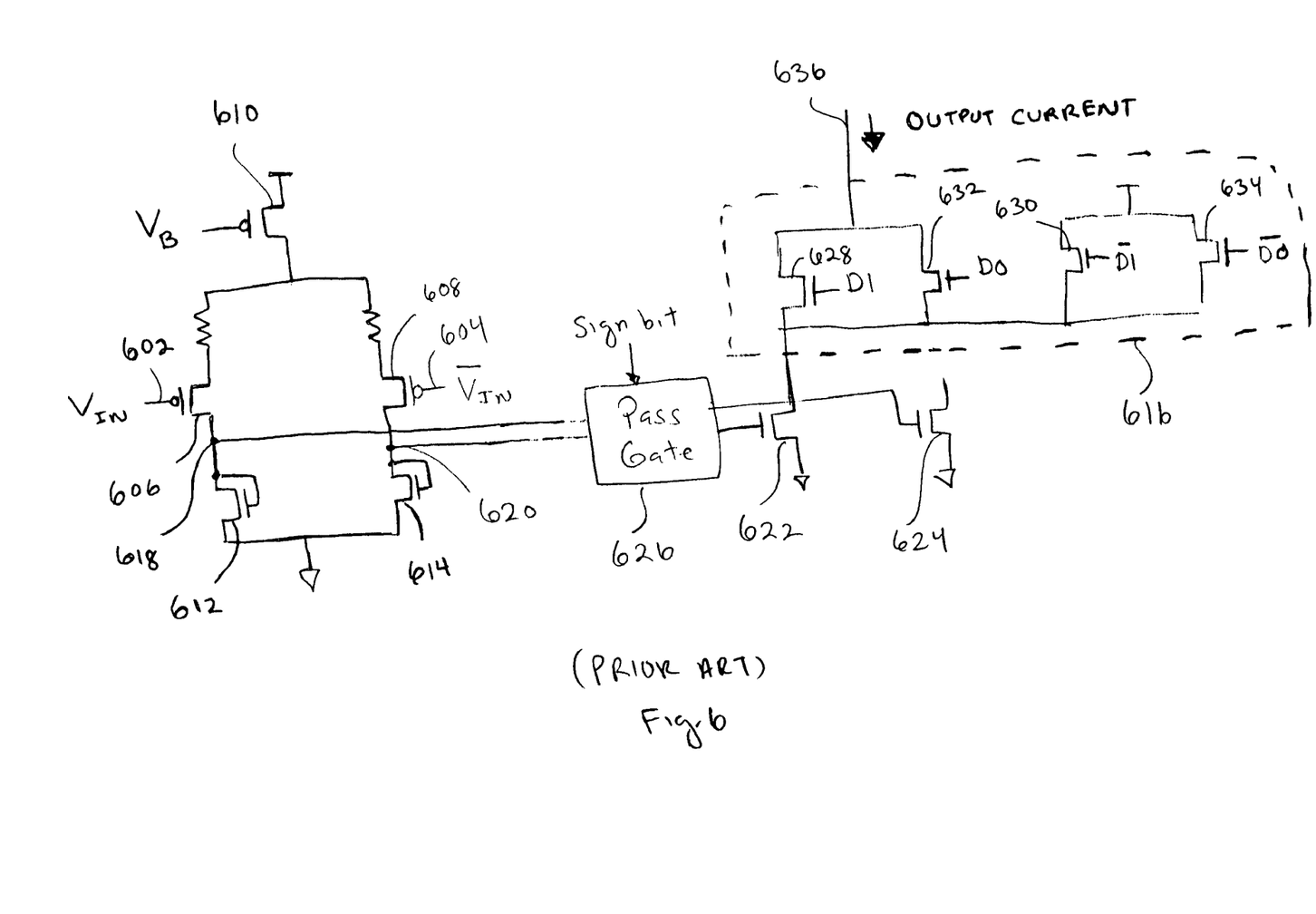
FIG. 6 is a combination of V-I converter and current multiplier at the transistor level.

An example of implementing a combination of V-I converter and current multiplier at the transistor level is provided in FIG. 6. A differential voltage signal is applied at input ports 602 and 604, where transistors 606 and 608 comprise a differential pair and transistor 610 is biased to provide the tail current. This combination of transistors comprises a V-I converter, providing currents to transistors 612 and 614. In some embodiments, the resulting currents may be provided directly to a current multiplier, like that indicated by dashed line 616. In the particular embodiment of FIG. 6, these currents are translated to voltages at nodes 618 and 620 and then provided to the gates of transistors 622 and 624, where the source-drain currents of transistors 622 and 624 are multiplied by a current mirror. The particular coupling between nodes 618 and 620 with the gates of transistors 622 and 624 determines the algebraic sign of the resulting filter weight. That is, pass gate 626 either connects nodes 618 and 620 to the gates of transistors 624 and 622, respectively, or connects nodes 618 and 620 to the gates of transistors 622 and 624, respectively.

The drains of transistors 622 and 624 are connected to a current multiplier. For simplicity, only the drain of transistor 622 is shown connected to a current multiplier. Actually, current multiplier 616 may be considered one-half of a differential current mirror, where the other half is identical in structure to that of 616, but with gate voltages complementary to that of current multiplier 616. For simplicity, only a two-bit current multiplier is shown, where the multiplier is represented by the two-bit word (D0, D1), where a zero bit may be taken as a gate voltage Vss and a one bit may be taken as a gate voltage Vcc, and where a bar over a bit indicates its Boolean complement. In the embodiment of FIG. 6, transistors 628 and 630 are matched to each other, having a width-to-length twice that of transistors 632 and 634, which are also matched to each other. Transistors 630 and 634 shunt current to the power rail, whereas transistors 628 and 632 shunt current via port 636. The other-half of the differential multiplier circuit, not shown, complementary to that of 616, would shunt current via another port (not shown) complementary to port 636 In this way, current multiplication is achieved. The resulting differential current is provided to latch 410.

Figure 7:
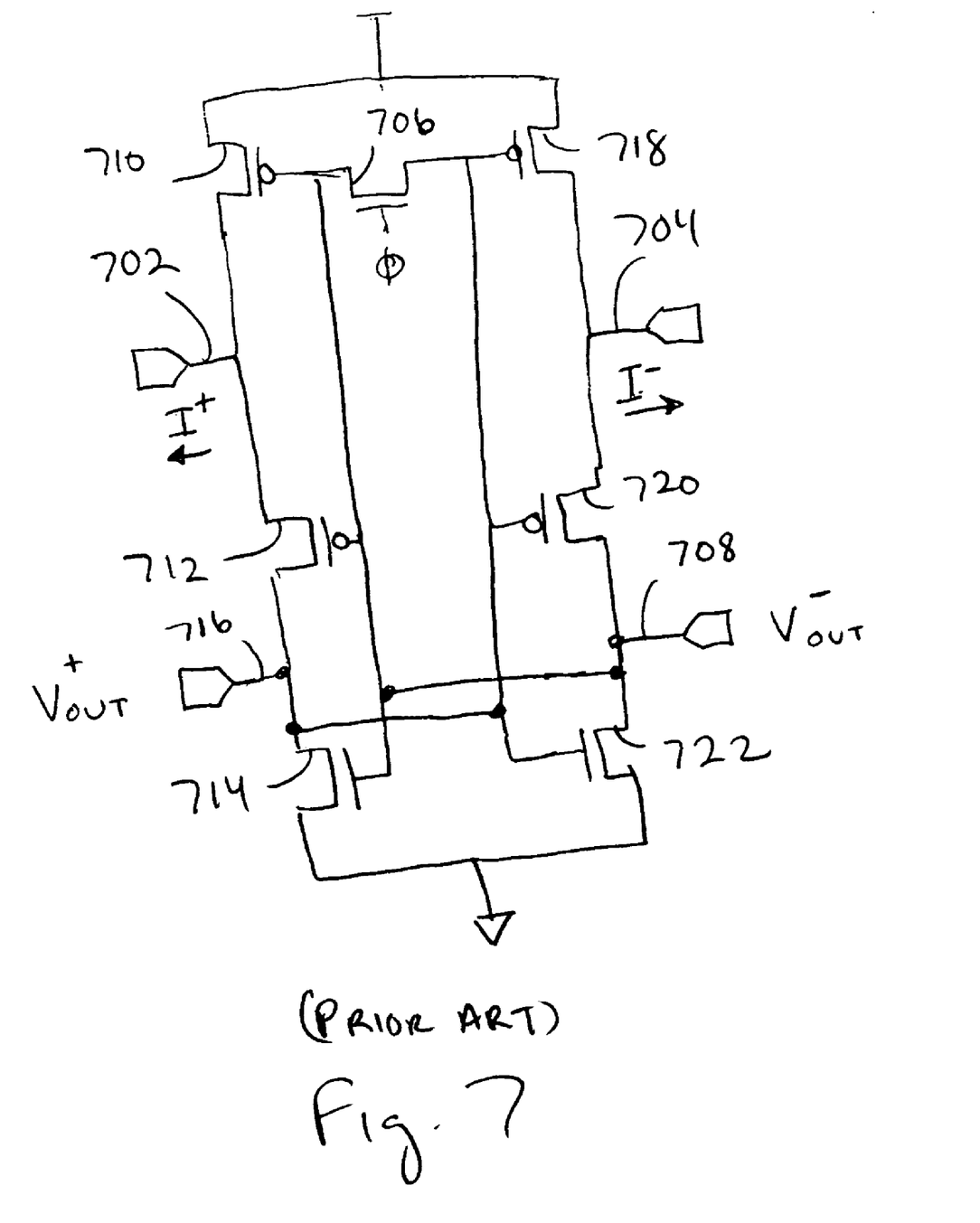
FIG. 7 is a latch at the transistor level.

FIG. 7 is an embodiment of latch 410 at the transistor level. Differential currents are sunk at ports 702 and 704 by a differential multiplier circuit. Before an evaluation period begins, transistor 706 is switched ON to equalize both sides of the latch, and when an evaluation period is about to begin, transistor 706 is switched OFF. The feedback connection from output port 708 to the gates of transistors 710, 712, and 714, and the feedback connection from output port 716 to the gates of transistors 718, 720, and 722 are such that when the evaluation period begins, a differential voltage develops at output ports 708 and 716 depending upon the differential currents sunk at ports 702 and 704. Eventually, this differential voltage develops to where one of the output ports is HIGH (Vcc) and the other is LOW (Vss), thereby providing the latch function.

FIG. 6 shows only one multiplier (or tap), but in practice a plurality of multipliers is realized by a plurality of V-I converters and current multipliers, where the differential currents for each multiplier are sunk at ports 702 and 704. With this in mind, it is more accurate to consider the circuit of FIG. 7 to incorporate both the functionality of latch 410 as well as summing junction 404, where the summing function is realized by the connection of the differential multiplier circuits to the differential ports 702 and 704.

During adaptation, the connections of reference current source 408 to the differential ports 702 and 704 and the connection of the differential current multipliers within TDL 402 to differential ports 702 and 704 are such that the difference between the currents $(-K+K_{offset})$ and $z_0(t)$ are realized during the first adaptation period, and the difference between the currents $(K+K_{offset})$ and $z_0(t)$ are realized during the second adaptation period. When no adaptation is taking place, reference current source 408 is adjusted to provide only the offset current $K_{offset}$.

Figure 8:
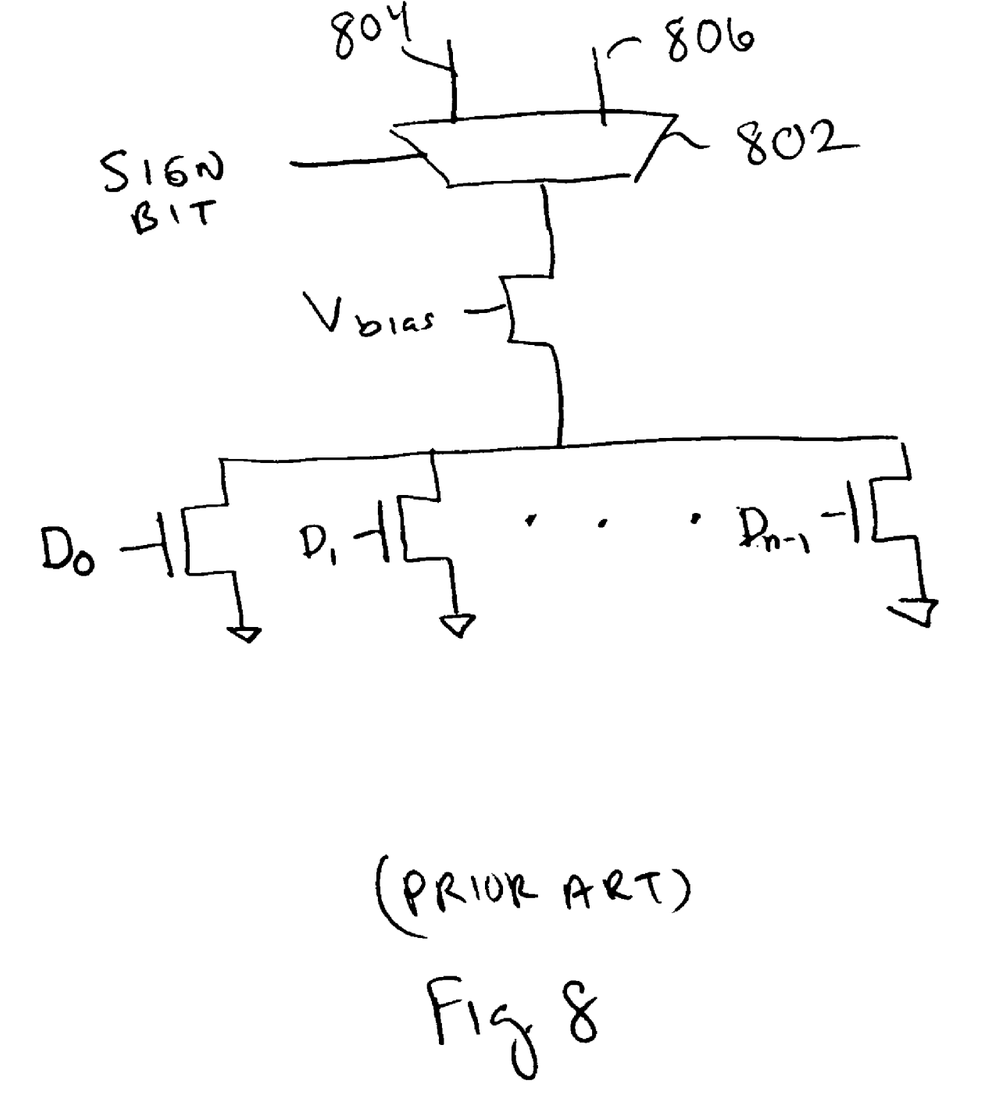
FIG. 8 is a current multiplier.

Reference current source 408 may be realized by a somewhat simpler circuit than the differential current multipliers used in TDL 402. For example, the current multiplier circuit of FIG. 8 may be utilized by the circuit shown in FIG. 8, where voltages indicative of an n-bit word $(D_0, D_1, \ldots, D_{n-1})$ are applied to the gates of the transistors as shown, and the ports 804 and 806 of MUX 802 are connected to the differential ports 702 and 704 of the latch of FIG. 7. The current sunk by the transistors in FIG. 8 is sunk at port 804 or port 806, depending upon the sign bit applied to MUX 802, which determines the overall sign of the offset provided by the circuit of FIG. 8.

Figure 9:
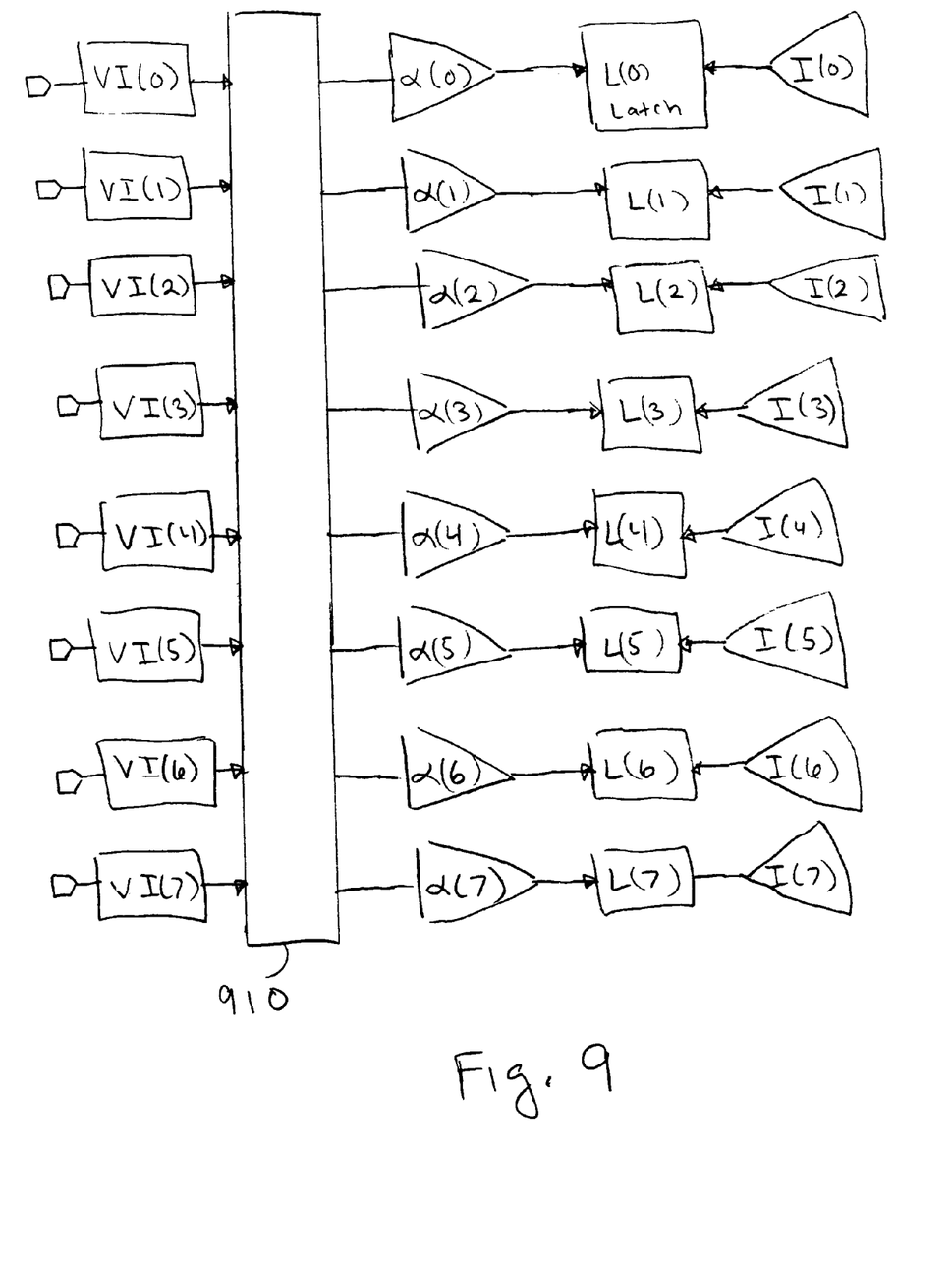
FIG. 9 is a high level filter architecture according to an embodiment of the present invention.

Basic components making up a discrete-time sampled-data system for equalization have been described for operation in both the adaptation modes and the non-adaptation mode. Described below with reference to FIG. 9 is an architecture for utilizing a plurality of V-I converters, current multipliers, and latches, so that a high data throughput may be realized. For ease of discussion, a four tap filter is described with respect to the embodiment of FIG. 9. Generalization to higher order tap filters is also discussed.

The embodiment illustrated in FIG. 9 implements a four tap filter by coupling eight V-I converters labeled as VI(i), i=0, ..., 7, to eight sets of current multipliers labeled as $\alpha(i)$=0, ..., 7, where each set has four current multipliers. Also in FIG. 9, the latches are labeled as L(i), i=0, ..., 7 and the reference current sources as I(i), i=0, ..., 7. For each i=0, ..., 7, the output for each set of current multipliers $\alpha(i)$ is summed with the output for current reference source I(i) and latched (and compared) by latch L(i) to provide the filtered (equalized) output signal. For simplicity, the summing functions are incorporated into the latches, and current sources for the current multipliers and reference current sources are not shown. Also for simplicity, the output ports of the latches are suppressed, and each V-I converter is shown with only one input port although there may be two input ports for differential signaling.

Figure 10A:
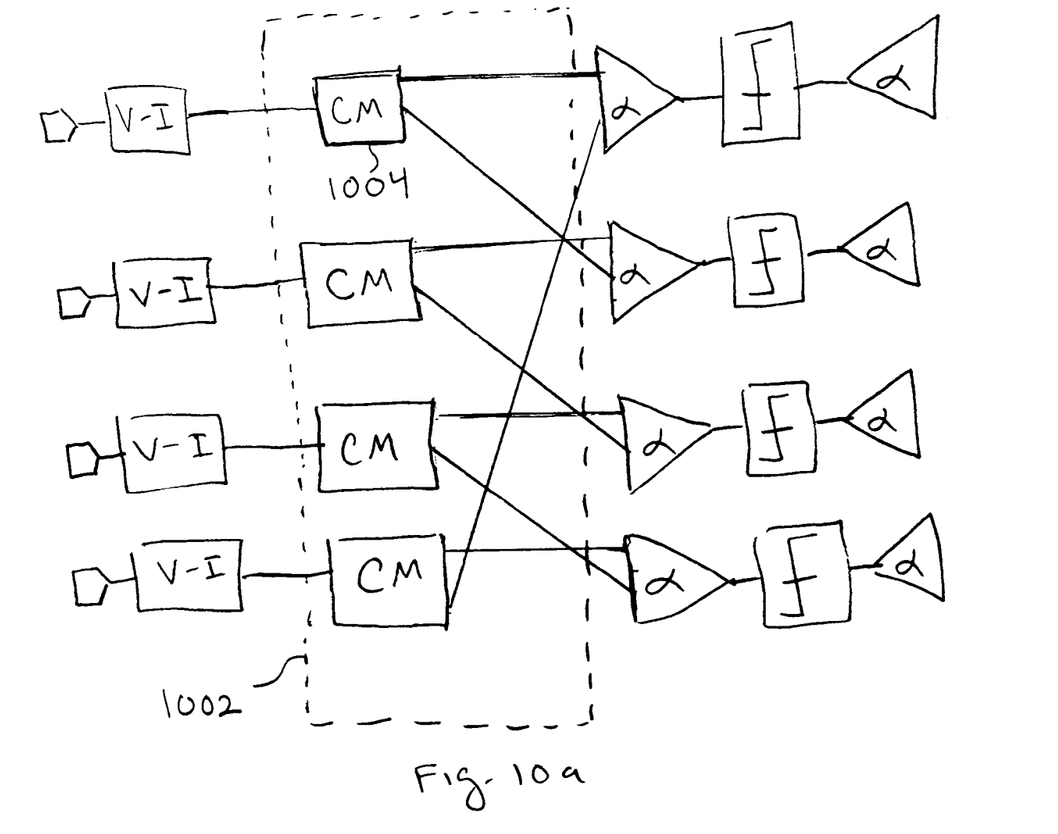
FIG. 10a is a high level filter architecture according to an embodiment of the present invention showing in more detail the coupling circuit to provide connections between voltage-to-current converters and current multipliers.
Figure 10B:
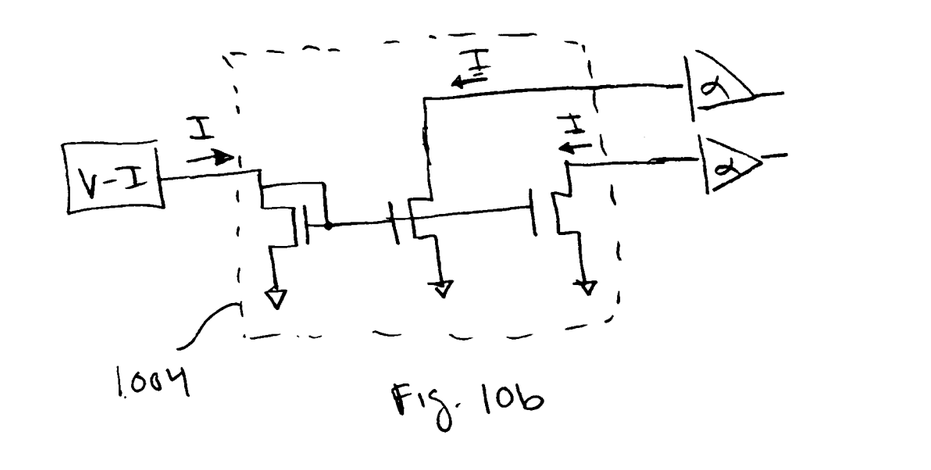
FIG. 10b is an example of a portion of the coupling circuit in FIG. 10a at the transistor level.

Coupling circuit 910 couples the V-I converters to the current multipliers. Each V-I converter is coupled to four sets of current multipliers, and each set of current multipliers receives current from four V-I converters. (For simplicity, these particular connections are not shown in detail in FIG. 9, but rather, a simple connection is shown between the current multipliers and coupling circuit 910.) More particularly, for some embodiments according to the architecture of FIG. 9, for each i=0 ..., 7, the output current (or currents in the case of differential signaling) of V-I converter VI(i) is coupled to sets of current multipliers $\alpha(j)$ where j ranges over the values j=(i+k) mod(8) for k=0,1,2,3. The coupling is realized by current mirrors. This may be made clear for the simpler case of a two tap filter by considering the architecture of FIG. 10a, showing a two tap filter architecture employing four V-I converters and four sets of current multipliers. In FIG. 10a, block 1002 is a coupling circuit comprising current mirrors, such as current mirror 1004, where FIG. 10b shows current mirror 1004 at the transistor level.

In general, for a n tap filter employing m V-I converters VI(i), i=0,1, ..., m−1, and m sets of current multipliers α(i), i=0,1, ..., m−1, where each set has n current multipliers, and where m≧n, the V-I converters and current multipliers may be coupled such that for each i=0, ..., m−1, the output current (or currents in the case of differential signaling) of VI(i) is coupled to the sets of current multipliers α(j) where j=(i+k) mod(m) and k=0,1,2, n−1.

Returning again to the specific case of a four tap filter employing eight V-I converters and four sets of current multipliers, let us continue with the description of the embodiment of FIG. 9 by assuming that at some time instance, samples s[i] have been made available to V-I converters VI(i) where i=0,1,2,3. Coupling circuit 910 provides the currents from these V-I converters to set of current multipliers α(3), where this set applies the filter weights to the samples. Latch L(3) adds these weighted samples, along with the offset provided by reference current source I(3), to provide the filtered output for the current time instance. While this is going on, sample s[4] has been provided to V-I converter VI(4), so that at the next time instance, samples s[i] are available to V-I converters VI(i) where i=1, ..., 4. Coupling circuit 910 provides the currents of V-I converters VI(i), i=1, ..., 4 to set of current multipliers α(4). Latch L(4) adds these weighted samples, along with the offset provided by reference current source I(4), to provide the filtered output.

It should be clear how the above description applies to the rest of the samples, where for each time instance, a new data sample is made available to a V-I converter. The desired filtered output is provided by the particular latch to which that V-I converter is coupled and to which the currents representing the previous three data samples are coupled. For example, eventually received sample s[8] is made available to V-I converter VI(0), displacing the previous sample to V-I converter VI(0), s[0]. In this case, because coupling circuit 910 couples the output currents of V-I converters VI(5), VI(6), VI(7), and VI(0) to current multiplier α(0), latch L(0) provides the desired filtered output.

By utilizing a plurality of V-I converters, multipliers, and latches, the architecture depicted in FIG. 9 allows time for each latch to evaluate and then be initialized before its next evaluation period begins. In this way, a high throughput may be obtained for the non-adaptive mode. Furthermore, the coupling arrangement between the V-I converters and current multipliers for the architecture of FIG. 9 makes efficient use of the V-I converters.

There may be other advantages to filter architectures that employ more V-I converters than the number of filter taps. For example, some algorithms, such as the sign-sign LMS (Least Means Square) algorithm, make use of the algebraic sign of the current and past received data samples, equal in number to the number for filter taps. That is, to update the filter at some time t, the algebraic signs of the received data samples for times t, t−1, t−2, and t−3 are needed for a four tap filter. For such adaptation algorithms, the architecture of FIG. 9 may be employed to provide this information. This may be accomplished by updating one set of current multiplier weights, but fixing the other sets of multiplier weights so as to provide the algebraic sign of the received samples. This is described in more detail below.

Consider the following example with reference to FIG. 9. Suppose the filter weights $\bar{h}_1$ associated with current multiplier α(1) are allowed to be updated, but that the filter weights associated with all of the other sets of current multipliers are fixed. Let these fixed weights be such that, for i≠1, current multiplier α(i) applies unity weight to data sample s[i], as well as future data samples s[i+8 k], k=1, 2, ..., but zero weight to the other data samples provided by coupling circuit 910. Then, latches L(i) for i≠1 provide sgn{s[i]}, i≠(1+8 k) for k=0,1,2, ....

However, we see that the above method does not yield the values sgn {s[(1+8 k)]} for k=0,1,2, .... If the adaptive algorithm being employed needs these missing values, then a similar procedure may be utilized for another iteration of the same training sequence, but for which now the set of current multipliers α(1) is fixed so that unity weight is now applied to samples s[(1+8 k)] for k=0,1,2, ..., and zero for the other samples. This provides an approximation to the missed samples in the previous iteration of the training sequence, where the approximation arises because the second set of received data samples for the same transmitted training sequence is not identical to the first set of received data samples due to noise in the communication channel. However, this approximation for many practical communication channels is sufficiently good.

However, some algorithms may not required these missing samples. For example, as discussed previously for the zero forcing algorithm, one of the adaptive filter weights for the filter vector $\bar{h}_1$ is fixed at unity during the adaptation process. If this fixed filter weight is the one that would multiply the samples sgn {s[(1+8 k)]} for k=0,1,2, ... when the adaptation period is completed, then these samples are not needed in the update algorithm.

Figure 11:
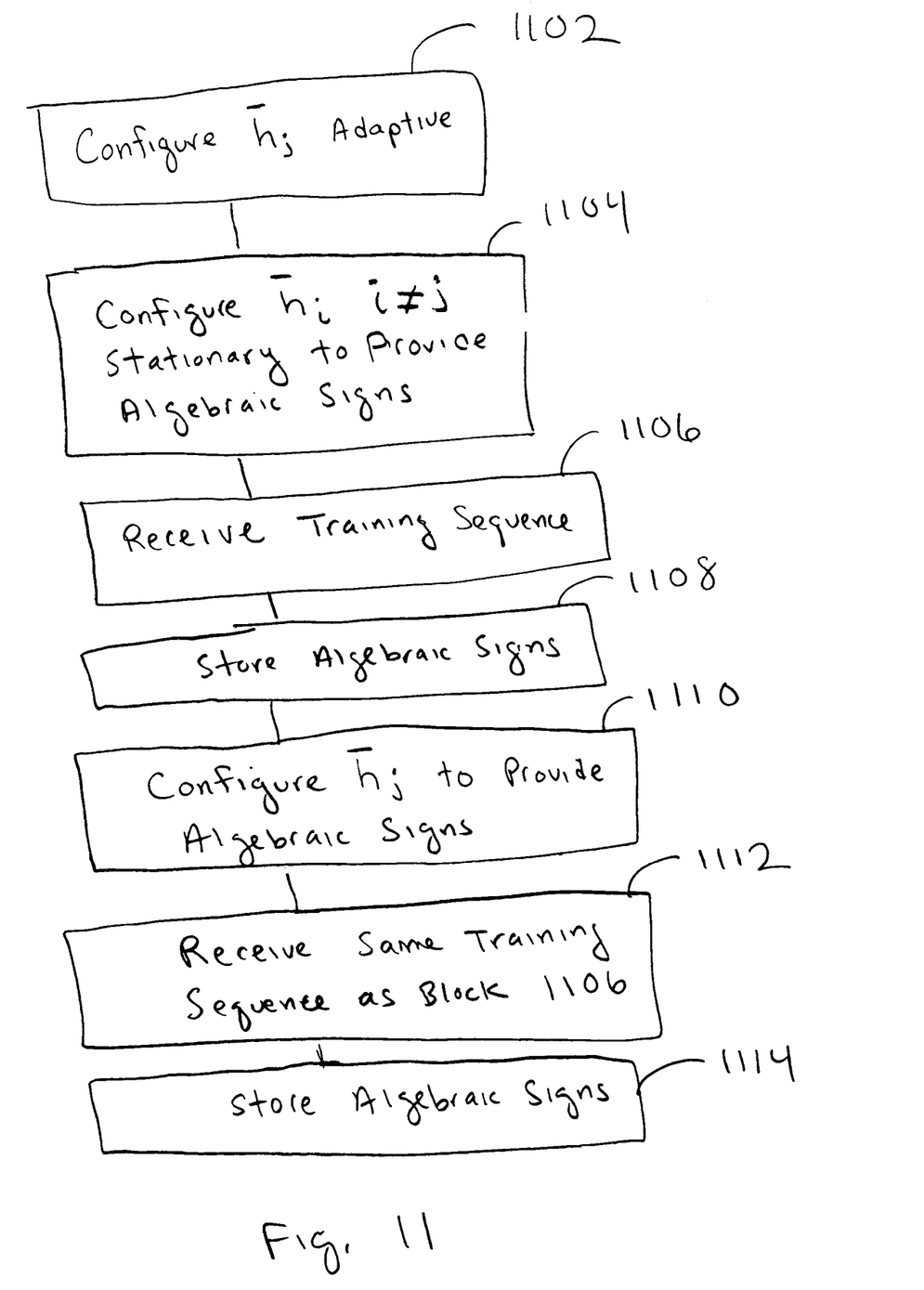
FIG. 11 is a flow diagram illustrating a procedure for obtaining the algebraic signs of received data samples.

FIG. 1 shows a flow diagram illustrating the above-described procedure. For a given bank of filters, in block 1102 a particular filter $\bar{h}_j$ is configured to be adaptive, whereas in block 1104 all other filters are configured to be stationary (non-adaptive) so as to provide algebraic signs of the received data samples. After receiving a training sequence in block 1106, these algebraic signs are stored as indicated in block 1108. However, as discussed previously, the algebraic sign of the data samples s[(j+8 k)] for k=0,1, 2, ..., are missing. To obtain these, in block 1110 the filter $\bar{h}_j$ is configured to be stationary so as to provide these missing algebraic signs after the same training sequence is transmitted and received as indicated in block 1112. These algebraic signs may then be stored, as indicated in block 1114. However, as discussed previously, the blocks 110, 112, and 114 may not be needed for the zero forcing algorithm, or similar such algorithms.

The procedure indicated in FIG. 11 need not be limited to the architecture indicated in FIG. 9. For example, a four tap filter comprising four V-I converters and four current multipliers, as well as a latch and a current reference source, may be repeated eight times. One of these repeated filter structures is chosen to be adaptive, corresponding to $\bar{h}_j$ is block 1102, and the remaining filter structures chosen to be stationary as in block 1104. However, an advantage of the embodiment of FIG. 9 is the re-use of various filter components, such as the V-I converters and its associated input circuitry.

It is to be understood in these letters patent that the meaning of "A is connected to B" is that A and B are connected by a passive structure for making a direct electrical connection so that the voltage potentials of A and B are substantially equal to each other. For example, A and B may be connected by way of an interconnect, transmission line, etc. In integrated circuit technology, the "interconnect" may be exceedingly short, comparable to the device dimension itself. For example, the gates of two transistors may be connected to each other by polysilicon or copper interconnect that is comparable to the gate length of the transistors.

It is also to be understood that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements. For example, A may be connected to a circuit element which in turn is connected to B.

It is also to be understood in these letters patent that a "current source" may mean either a current source or a current sink. Similar remarks apply to similar phrases, such as, "to source current".

It is also to be understood that various circuit blocks, such as current mirrors, amplifiers, etc., may include switches so as to be switched in or out of a larger circuit, and yet such circuit blocks may still be considered connected to the larger circuit because the various switches may be considered as included in the circuit block.

What is claimed is:

1. A circuit comprising:
   a family of filters; and
   an adapter functional unit to adjust the family of filters so that a filter belonging to the family of filters is adapted during a first received training sequence of data samples and all other filters belonging to the family of filters are stationary to provide signals indicative of algebraic signs of some of the data samples in the first received training sequence.

2. The circuit as set forth in claim 1, wherein the adapter functional unit adjusts the filter adapted during the first received training sequence to be stationary during a second received training sequence of data samples so as to provide the algebraic signs of some of the data samples in the second received training sequence.

3. The circuit as set forth in claim 2, wherein each filter belonging to the family of filters comprises
   a tap delay line to provide a set of currents;
   a current source to provide a reference current; and
   a latch functional unit to sum the set of currents and the reference current.

4. The circuit as set forth in claim 1, wherein each filter belonging to the family of filters comprises
   a tap delay line to provide a set of currents;
   a current source to provide a reference current; and
   a latch functional unit to sum the set of currents and the reference current.

5. The circuit as set forth in claim 1, wherein the family of filters comprises a set of voltage-to-current converters and a set of current multipliers.

6. The circuit as set forth in claim 2, wherein the family of filters comprises a set of voltage-to-current converters and a set of current multipliers.

7. A circuit comprising:
   a family of filters $\overline{h}_i$, $i=0, \ldots, m-1$, each filter $\overline{h}_i$ comprising n taps $[\overline{h}_i]_k$ $k=0, \ldots, n-1$, and
   an adapter functional unit to adapt the filter $\overline{h}_j$ based on received data samples of a first training sequence, wherein the adapter functional unit fixes the filters $\overline{h}_i$, $i \neq j$ so that weights $[\overline{h}_i]_k$ for $i \neq j$ are unity for some $k=k_0$ and zero otherwise.

8. The circuit as set forth in claim 7, wherein during reception of a second training sequence, the adapter functional unit fixes the filter $\overline{h}_j$ to be stationary where the filter weight $[\overline{h}_j]_k$ is unity for $k=k_0$ and zero otherwise.

9. The circuit as set forth in claim 8, wherein each filter $\overline{h}_i$, $i=0, \ldots, m-1$, comprises n voltage-to-current converters and n current multipliers.

10. The circuit as set forth in claim 8, wherein the family of filters comprises N voltage-to-current converters and N sets of current multipliers, each set of current multipliers comprising n current multipliers, where n<N<mn.

11. The circuit as set forth in claim 7, wherein each filter $\overline{h}_i$, $i=0, \ldots, m-1$, comprises n voltage-to-current converters and n current multipliers.

12. The circuit as set forth in claim 7, wherein the family of filters comprises N voltage-to-current converters and N sets of current multipliers, each set of current multipliers comprising n current multipliers, where n<N<mn.

13. The circuit as set forth in claim 7, wherein during reception of the first training sequence the adapter functional unit fixes $[\overline{h}_j]_k$ to unity for $k=k_0$.

14. The circuit as set forth in claim 13, wherein each filter $\overline{h}_i$, $i=0, \ldots, m-1$, comprises n voltage-to-current converters and n current multipliers.

15. The circuit as set forth in claim 13, wherein the family of filters comprises N voltage-to-current converters and N sets of current multipliers, each set of current multipliers comprising n current multipliers, where n<N<mn.

16. A communication system comprising:
    a transmitter to transmit a first training sequence of data samples; and
    a receiver comprising:
       a family of filters $\overline{h}_i$, $i=0, \ldots, m-1$, each filter $\overline{h}_i$ comprising n taps $[\overline{h}_i]_k$ $k=0, \ldots, n-1$, and
       an adapter functional unit to adapt the filter $\overline{h}_j$ based on the received data samples of the first training sequence, wherein the adapter functional unit fixes the filters $\overline{h}_i$, $i \neq j$ so that weights $[\overline{h}_i]_k$ for $i \neq j$ are unity for some $k=k_0$ and zero otherwise.

17. The communication system as set forth in claim 16, wherein during reception of a second training sequence, the adapter functional unit fixes the filter $\overline{h}_j$ to be stationary where the filter weight $[\overline{h}_j]_k$ is unity for $k=k_0$ and zero otherwise.

18. The communication system as set forth in claim 17, wherein each filter $\overline{h}_i$, $i=0, \ldots, m-1$, comprises n voltage-to-current converters and n current multipliers.

19. The communication system as set forth in claim 17, wherein the family of filters comprises N voltage-to-current converters and N current multipliers, where n<N<mn.

20. The communication system as set forth in claim 16, wherein each filter $\overline{h}_i$, $i=0, \ldots, m-1$, comprises n voltage to current converters and n current multipliers.

21. The communication system as set forth in claim 16, wherein the family of filters comprises N voltage-to-current converters and N sets of current multipliers, each set of current multipliers comprising n current multipliers, where n<N<mn.

22. The communication system as set forth in claim 16, wherein during reception of the first training sequence the adapter functional unit fixes $[\overline{h}_j]_k$ to unity for $k=k_0$.

23. The communication system as set forth in claim 22, wherein each filter $\overline{h}_i$, $i=0, \ldots, m-1$, comprises n voltage-to-current converters and n current multipliers.

24. The communication system as set forth in claim 22, wherein the family of filters comprises N voltage-to-current converters and N sets of current multipliers, each set of current multipliers comprising n current multipliers, where n<N<mn.

25. A method to adapt a filter, the method comprising:
    providing a family of filters $\overline{h}_i$, where $i=0, \ldots, m-1$, and wherein each filter $\overline{h}_i$ has n taps $[\overline{h}_i]_k$ $k=0, \ldots, n-1$;
    adjusting a filter $\overline{h}_j$ belonging to a family of filters $\overline{h}_i$, $i=0, \ldots, m-1$, to be adaptive; and
    fixing the filters $\overline{h}_i$, $i \neq j$ to be stationary so that weights $[\overline{h}_j]_k$ for $i \neq j$ are unity for some $k=k_0$ and zero otherwise.

* * * * *